(12) United States Patent
Fitzpatrick (10) Patent No.: US 10,620,367 B2
(45) Date of Patent: Apr. 14, 2020

(54) MULTIPLE LIGHT PIPE STRUCTURE FOR ELECTRONIC DEVICES

(71) Applicant: Interdigital CE Patent Holdings, Paris (FR)

(72) Inventor: Nathan Fitzpatrick, Indianapolis, IN (US)

(73) Assignee: InterDigital CE Patent Holdings, Paris (FR)

(*) Notice: Subject to any disclaimer, the term of this patent is extended or adjusted under 35 U.S.C. 154(b) by 18 days.

(21) Appl. No.: 15/509,326

(22) PCT Filed: Aug. 28, 2015

(86) PCT No.: PCT/US2015/047333
§ 371 (c)(1),
(2) Date: Mar. 7, 2017

(87) PCT Pub. No.: WO2016/040003
PCT Pub. Date: Mar. 17, 2016

(65) Prior Publication Data
US 2017/0285256 A1    Oct. 5, 2017

Related U.S. Application Data

(60) Provisional application No. 62/048,408, filed on Sep. 10, 2014.

(51) Int. Cl.
*F21V 8/00*     (2006.01)
*H05K 5/02*     (2006.01)

(52) U.S. Cl.
CPC ......... *G02B 6/0096* (2013.01); *G02B 6/0001* (2013.01); *G02B 6/0006* (2013.01);
(Continued)

(58) Field of Classification Search
CPC ...... G02B 6/0096; G02B 6/0008; H05K 5/02; H05K 5/0217
(Continued)

(56) References Cited

U.S. PATENT DOCUMENTS

| 4,772,769 A | 9/1988 | Shumate |
| 5,268,823 A | 12/1993 | Yergenson |

(Continued)

FOREIGN PATENT DOCUMENTS

WO    WO2012174266    12/2012

OTHER PUBLICATIONS

Extended European Search Report dated May 3, 2018.

*Primary Examiner* — Andrew J Coughlin
(74) *Attorney, Agent, or Firm* — Jerome G. Schaefer; Richard LaPeruta (57) ABSTRACT

The present principles are an illumination system for the front of an electronic device such as a set top box. The device includes a casing having a front wall; apertures on the front wall; a backlight assembly in back of the front wall within the casing; and a light pipe structure to receive light from backlight assembly. The light pipe structure includes plurality of light pipes in which the light pipes have a lower vertical body portion, an upper horizontal body portion, and a central body portion between the lower vertical body portion and the upper horizontal body portion; and a bracket that connects and supports the light pipes in which the bracket is generally planar. The bracket has broad support regions that connect to a back portion of each of the light pipes and a narrow bridging region between broad support regions in which the support regions are broader than the narrow bridging region in the vertical dimension.

20 Claims, 9 Drawing Sheets

(52) U.S. Cl.
CPC ............. *G02B 6/0008* (2013.01); *H05K 5/02* (2013.01); *H05K 5/0217* (2013.01); *G02B 6/0081* (2013.01)

(58) Field of Classification Search
USPC .......................................................... 362/581
See application file for complete search history.

(56) References Cited

U.S. PATENT DOCUMENTS

| | | | |
|---|---|---|---|
| 5,327,328 A * | 7/1994 | Simms | G02B 6/0001 362/23.07 |
| 5,481,440 A * | 1/1996 | Oldham | G02B 6/0001 340/815.45 |
| 5,760,754 A | 6/1998 | Amero, Jr. et al. | |
| 5,938,324 A | 8/1999 | Salmon et al. | |
| 7,293,904 B2 | 11/2007 | Beitelspacher | |
| 7,538,285 B2 | 5/2009 | Patel et al. | |
| 8,534,892 B2 | 9/2013 | Letourneau et al. | |
| 10,120,121 B2 * | 11/2018 | Huang | G02B 6/0078 |
| 2009/0109700 A1 | 4/2009 | Yi et al. | |
| 2011/0141732 A1 * | 6/2011 | Shiroishi | F21V 33/0052 362/235 |
| 2012/0026750 A1 | 2/2012 | Letourneau et al. | |

\* cited by examiner

PRIOR ART

FIG. 3(A)

PRIOR ART

FIG. 3(B)

PRIOR ART

MULTIPLE LIGHT PIPE STRUCTURE FOR ELECTRONIC DEVICES

CROSS REFERENCES

This application claims the benefit, under 35 U.S.C. § 365 of International Application PCT/US2015/047333 filed Aug. 28, 2015 which was published in accordance with PCT Article 21(2) on Mar. 17, 2016 in English and which claims priority to U.S. Provisional Application Ser. No. 62/048,408, filed on Sep. 10, 2014, which is incorporated by reference herein in its entirety.

TECHNICAL FIELD

The present principles relate generally to electronic devices and, more particularly, to an electronic device having a multiple light pipe structure for illuminating logos, button and/or indicator signals.

BACKGROUND

Many manufacturers and consumers prefer that electronic devices have logos, buttons, and indicator signals which are illuminated by light pipe assemblies such that the products can be identified, active buttons on the products can be identified, and the status of the device can be visually signaled to the user, respectively.

Unfortunately, the illumination of logos, buttons, and indicator signals adds costs to devices and also requires that some additional volume within the device be dedicated to support the illumination. As such, individual light pipe assemblies are less preferred for individual logos, buttons, and indicator signals than a unitary light pipe structures with multiple light pipes, because such unitary structures reduces the number of parts within the electronic device, promotes compactness and can simplify manufacturing.

However, when such unitary structures are employed in which a plurality of individual light pipes are each dedicated for a different light emitting element, light from one light emitting element intended for one light pipe can propagate, bleed or leak through the unitary structure to an unintended light pipe. This unintended illumination will be referred to a leakage. These unitary structures permit such leakage, because they tend to be a single molded part.

The leakage has been recognized by Applicant as a waste of energy.

Figure 1:
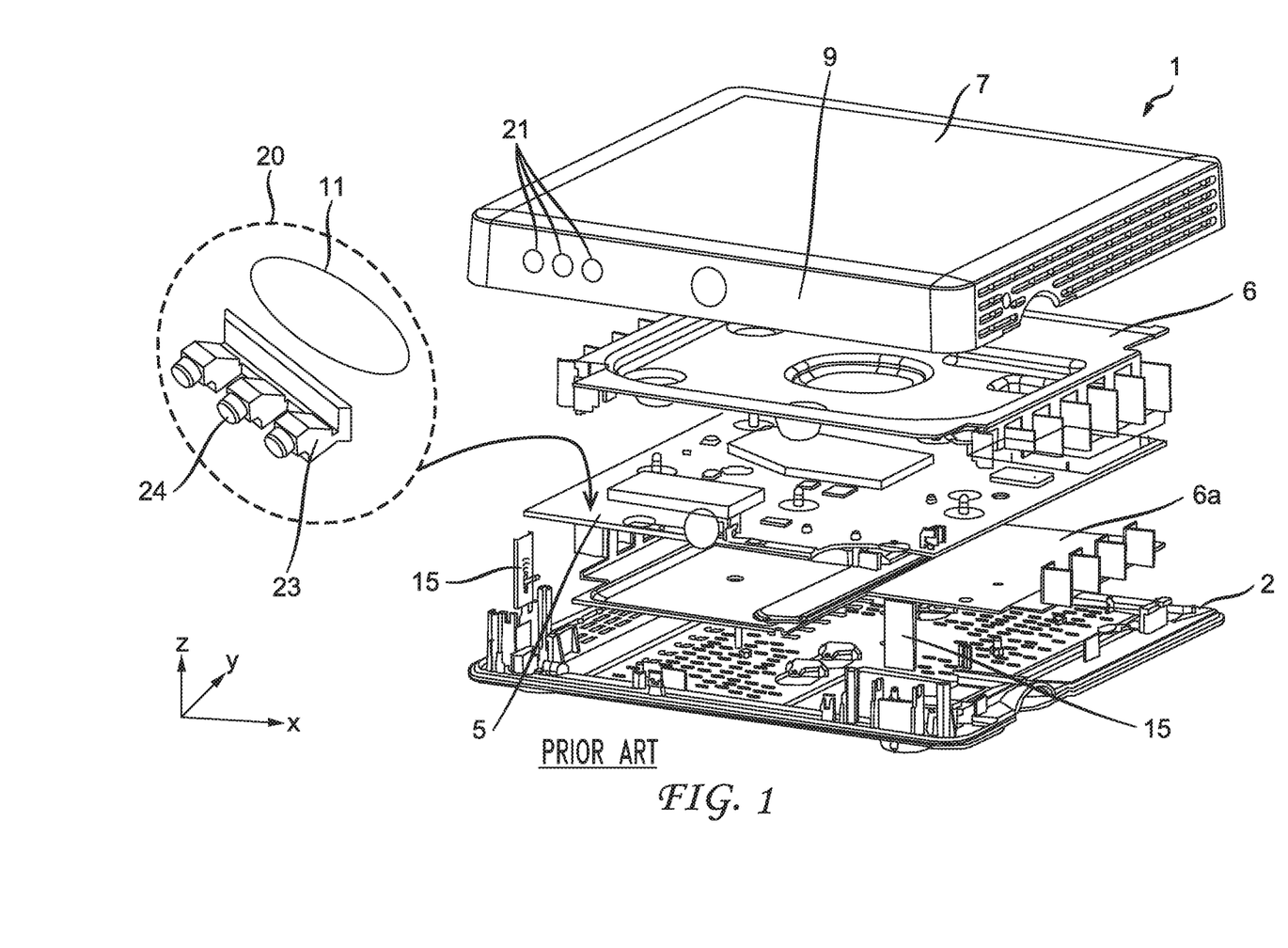
FIG. 1 shows a perspective view of a disassembled electronic device that employs a known unitary light pipe structure.

Additionally, this light leakage can also be annoying to the user, because the logos, buttons, and indicator signals which are illuminated by this leakage or further illuminated by this leakage can give the viewer false information and often cause the viewing surface at the end of the light pipe that receives the leakage to be non-uniformly illuminated. This non-uniformity is aesthetically unpleasant and can cause the viewer to believe the device is not operating properly. For example, if only one light emitting element is activated, some of the light is emitted into the adjacent light pipes giving the impression that those indicators are active when, in fact, they are not active. FIG. 1 shows an example electronic device that employs such unitary light pipe structures and FIG. 3 shows an example of the problem associated with the prior light pipe structures.

FIG. 1 shows the electronic device 1 having a logo, button or indicator signal assembly 20 and how it can be positioned in the electronic device 1 which can be a set top box. The assembly 20 includes a backlight assembly 11 and a unitary light pipe structure 23. The front surface 24 of the light pipe structure 23 is positioned at the aperture 21 of a front wall 9 of the device 1. The apertures can be associated for a number functions which can include an indicator for a "record" function. FIG. 1 shows that the assembly 20 can be positioned near or over a printed circuit board (pcb) 5. The backlight assembly 11 can be positioned on the pcb 5 and be positioned behind or under the light pipe structure 23 and behind the front wall 9. The electronic device 1 can include a flange which can have peripheral portion or planar peripheral portion defining the shape of the aperture 21 through which the front surface 24 of the light pipe structure 23 is viewed. The assembly 20 can be designed to be a button that can be pressed by a finger and activated by applying pressure on an actuator (not shown) which can be positioned at a rear portion of the light pipe structure.

Figure 2A:
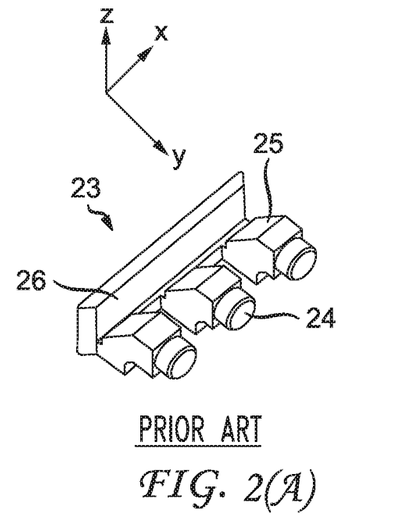
FIG. 2 shows various views of a known unitary light pipe structure.
Figure 2B:
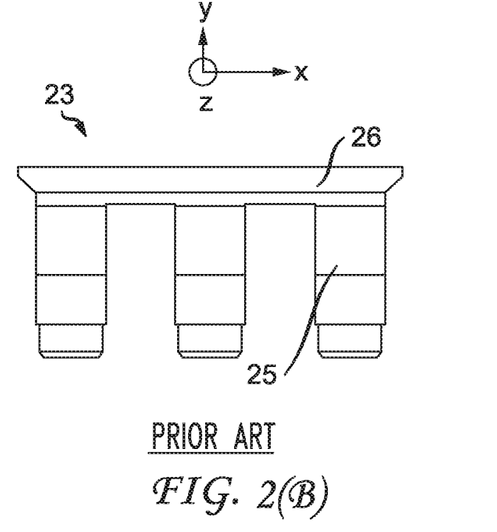
Figures 2C, 2D:
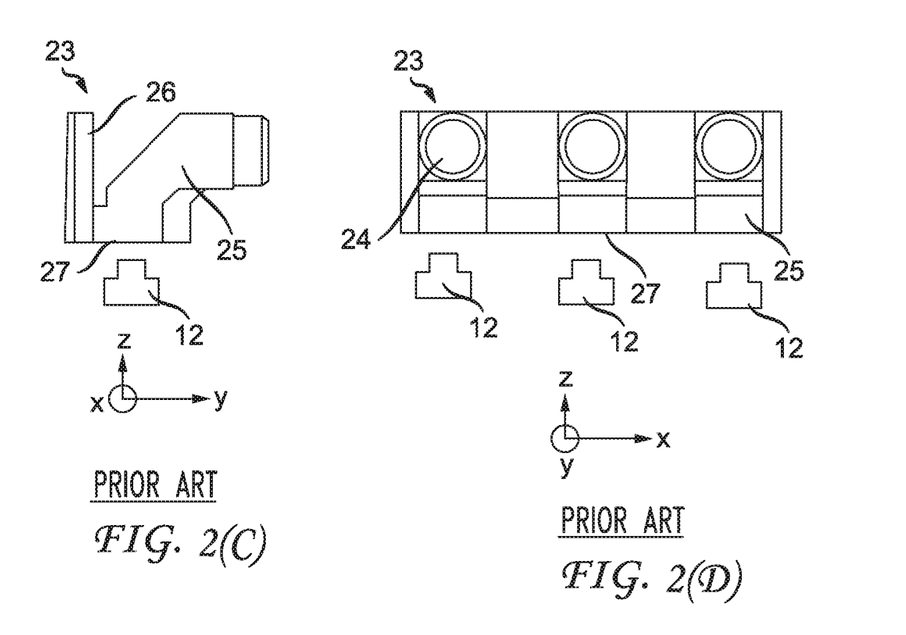

FIG. 2 shows various views of a known light pipe structure and FIG. 3 shows the effect of using the known light pipe structure when only one indicator is activated. More specifically, FIGS. 2A, 2B and 2D show views in which the light pipe structure 23 includes three light pipes 25 and FIGS. 2C and 2D show a side view and a front plan view, respectively, of the light pipe structure 23 which further show how individual light emitting elements 12 can be positioned at the entrance or bottom surface 27 of the light pipes 25 to permit light exiting from the top of the individual light emitting elements 12 to enter the light pipes 25. The light pipe bracket 26 is a component of the light pipe structure 23 as shown in the views of FIG. 2. The bracket 26 is a generally a planar vertically oriented structure that is parallel to the front surface 24 of the light pipes 25 and set back from the light pipes 25. The bracket 26 supports the light pipes and provides a way to maintain the light pipes away from one another. The bracket 26 attaches to a rear portion of the light pipes 25.

Figure 3A:
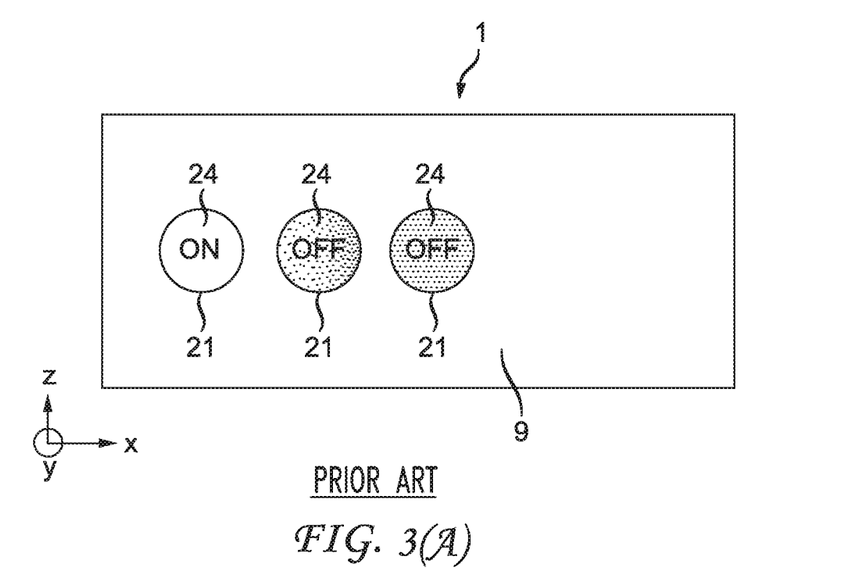
FIG. 3 shows front plan views of a known electronic device showing different signal states.
Figure 3B:
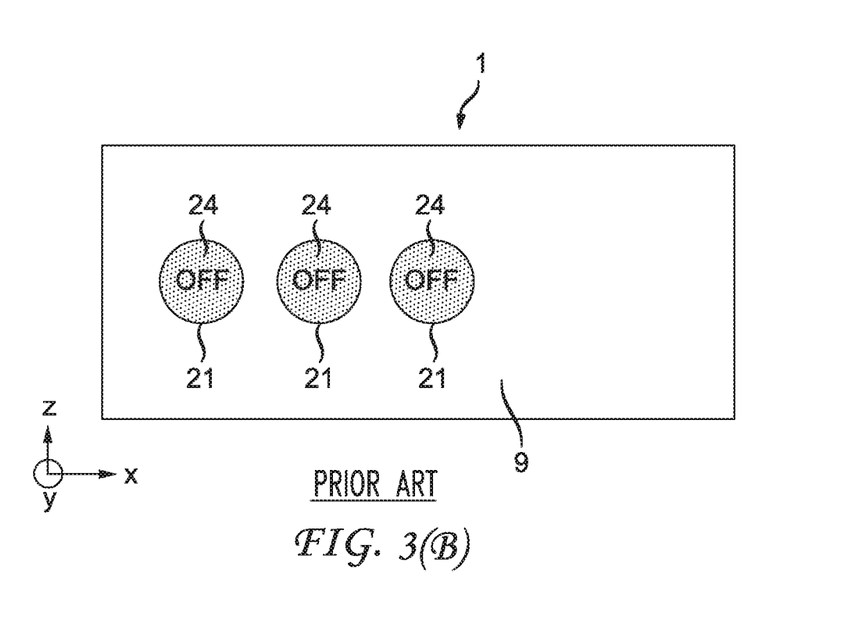

As mentioned above, when the light pipe structure 23 is a single molded part that employs multiple light pipes 25 that receive light from different dedicated light emitting elements 12, light from one light emitting element 12 intended for one light pipe can propagate, bleed or leak through the unitary structure to an unintended light pipe. It has been determined that much of this leakage occurs through light propagating in an intended light pipe 25 reflecting or scattering back into the bracket 26. Once the light is in the bracket it can propagate into other unintended light pipes 25 and can provide false or unclear indications. This is shown in the views of the front portion 9 of the set top box 1 in FIG. 3. FIG. 3A shows an example in which light emitting element or elements 12 for the left light pipe 25 are on and the light emitting element or elements 12 for the middle and right light pipe 25 are off. This example shows by way of a solid white color that the left light pipe 25 is properly illuminating the front surface 24 of the light pipe 25; however, this view further shows that the adjacent middle light pipe 25 has light leaking into it to partially and non-uniformly illuminating the front surface 24 of the middle light pipe 25 to give a false or confusing signal indication for the function associated with the middle light pipe. FIG. 3B shows the front surfaces 24 of the light pipes 25 when the light emitting elements 12 are not activated.

Figure 4:
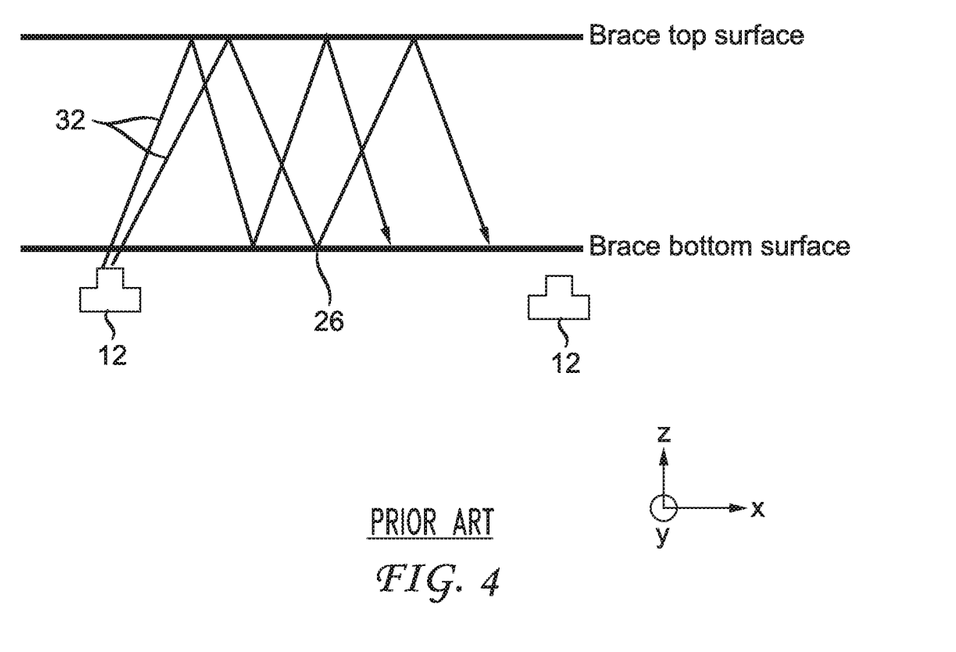
FIG. 4 shows a view of light propagation within the light pipe bracket of a known unitary light pipe structure.

FIG. 4 is a simplified plan view perspective providing an example of how the light 32 from a left light emitting element 12 that is assigned to one light pipe once in the bracket 26 of the known light pipe structure can propagate laterally with respect to the x-z plane to regions in the bracket 26 that are at and associated with other light emitting elements 12 and other light pipes. This light that propagates laterally can then enter other unintended light pipes to cause false or confusing signal indications. The light 32 is light that has leaked from the light pipe 25 into the bracket 26.

In light of the light leakage problem associated with the known light pipe structure 23, a need exists for a single molded part unitary light pipe structure having multiple light pipes that does not have a propensity for light leakage.

SUMMARY

The present principles include a light pipe structure 523 having a plurality of light pipes 525 and a bracket 526. Each light pipe can have a lower vertical body portion 540, an upper horizontal body portion 541, and a central body portion 542 between the lower vertical body portion and the upper horizontal body portion. The light pipes and the bracket of the light pipe structure can be a unitary structure and the structure can be made of one homogenous material. The bracket connects and supports the light pipes.

The bracket can be generally planar and have a support region 530 that connects to a back portion 531 of each of the light pipes. The bracket can also include at least one narrow bridging region 532 between the broad support regions. The broad support regions can be broader than the at least one narrow bridging region in the vertical dimension. The at least one narrow bridging region between lateral positions of the light pipes can have a bottom surface that is positioned higher in the vertical dimension than any part of the back portion of each of the light pipes that contact the support regions. Each narrow bridging region can also have a vertical breadth that narrows from proximal regions 533 adjacent to the broad support regions to a central portion 534. Each narrow bridging region can have a top surface and the top surface and/or the bottom surface can have an inward facing concave shape from the proximal regions to the central portion.

The back portion of each of the light pipes can be part of the lower vertical body portion and the central body portion can be curved or disposed at an angle to cause light vertically directed into the lower vertical body portion to be horizontally directed into the upper horizontal body portion. The light pipes further can include a bottom surface 527 in the lower vertical body portion for entry of light and can include a front surface 524 in the upper horizontal body portion for light to exit.

The present principles include an electronic device such as a set top box 501 that includes a casing having front wall 9; apertures 521 in the front wall; a backlight assembly 511 in back of the front wall within the casing; and a light pipe structure 523 designed to receive light 32 from the backlight assembly in which the light pipe structure includes a plurality of light pipes 525 and a bracket 526 having at least one narrow bridging region 532 between broad support regions 530. The light pipes can have a lower vertical body portion 540, an upper horizontal body portion 541, and a central body portion 542 between the lower vertical body portion and the upper horizontal body portion. The light pipes can have front surfaces 524 in the upper horizontal body portions in which the front surfaces are positioned at or in the apertures. The bracket 526 connects and supports the light pipes and the bracket can be generally planar in which the broad support regions connect to a back portion 531 of each of the light pipes.

BRIEF DESCRIPTION OF THE DRAWINGS

The present principles may be better understood in accordance with the following exemplary figures, in which.

DETAILED DESCRIPTION

The invention will now be described in greater detail in which embodiments of the present principles are illustrated in the accompanying drawings.

Figure 5:
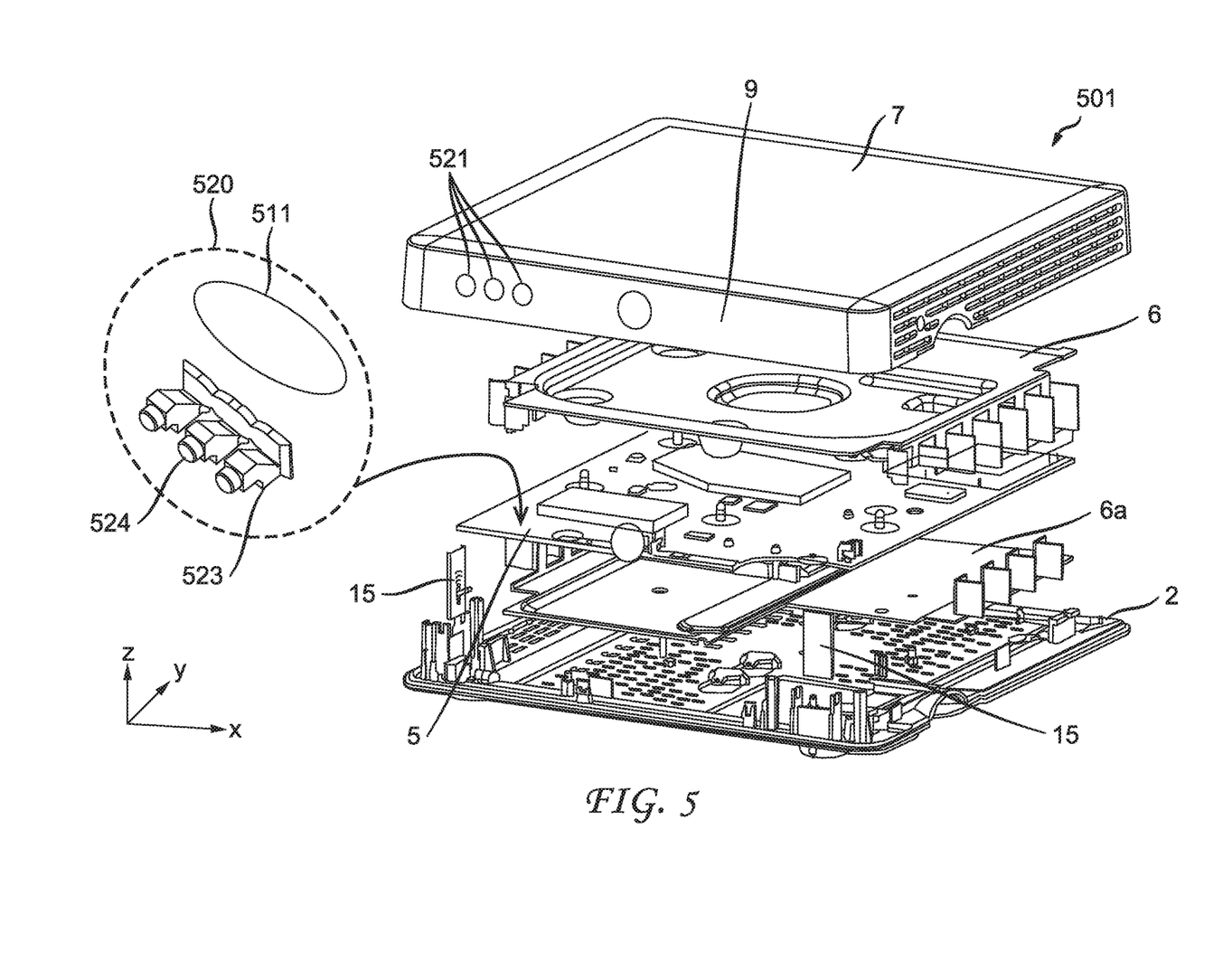
FIG. 5 shows a perspective view of a disassembled electronic device that employs a unitary light pipe structure according to the present principles.

FIG. 5 shows the electronic device 501 having a logo, button or indicator signal assembly 520 and how it can be positioned in the electronic device 501 which can be a set top box. The assembly 520 includes backlight assembly 511 and a unitary light pipe structure 523. The front surface 524 of the light pipe structure 523 is positioned at the apertures 521 of a front wall 9 of the device 501. The apertures can be associated with a number of functions which can include an indicator for a "record" function. FIG. 5 shows that the assembly 520 can be positioned near or over a printed circuit board (pcb) 5. The backlight 11 can be positioned on the pcb 5 and be positioned under or behind the light pipe structure 523 and behind the front wall 9. The electronic device 501 can include a flange which can have peripheral portion or planar peripheral portion defining the shape of the aperture 521 through which the front surface 524 of the light pipe structure 523 is viewed. The assembly 520 can be designed to be a button that can be pressed by a finger and activated by applying pressure on an actuator (not shown) which can be positioned at a rear portion of the light pipe structure.

As illustrated in FIG. 5, the light pipe structure 523 can be housed in electronic device 501 and the electronic device can have a top cover 7 and a bottom frame 2. The electronic device 501 can include other components such as various heatsinks 6, 6a and antennae 15. The heatsinks 6, 6a can be strategically positioned to effectively manage heat generated by the internal components, which include the backlight assembly 511.

Figure 6A:
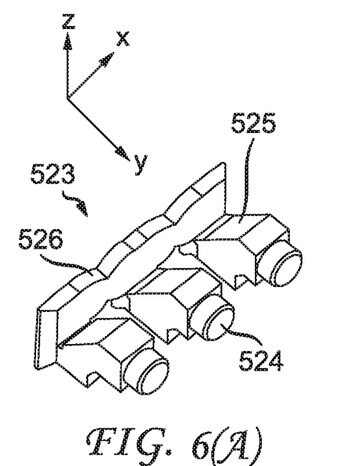
FIG. 6 shows various views of the unitary light pipe structure according to the present principles.
Figure 6B:
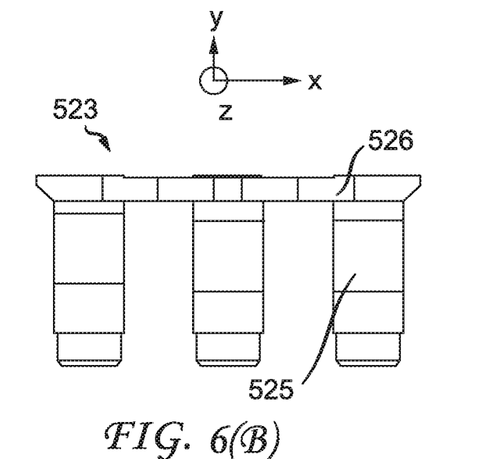
Figure 6C:
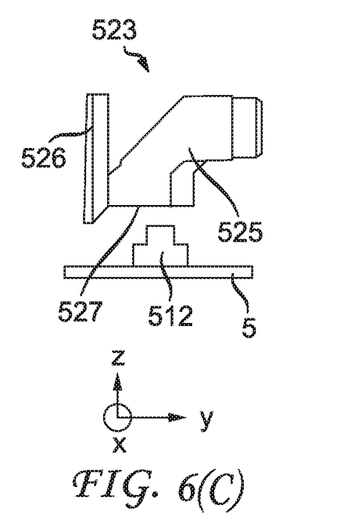
Figure 6D:
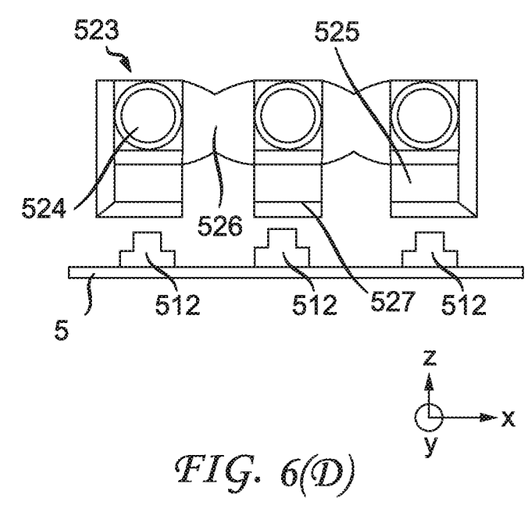

FIGS. 6A-6D show various views of the light pipe structure 523 according to the present principles. More specifically FIGS. 6A, 6B and 6D show views in which the light pipe structure 523 includes three light pipes 525 and FIGS. 6C and 6D show a side view and a front plan view, respectively, of the light pipe structure 523. FIGS. 6C and 6D further show how individual light emitting elements 512 can be positioned at the entrance or bottom surface 527 of the light pipes 525 to permit light exiting from the top of the individual light emitting elements 512 to enter the light pipes 525. The light pipe bracket 526 is a component of the light pipe structure 523 as shown in the views of FIG. 6. The bracket 526 can be a generally planar vertically oriented structure that is parallel to the front surface 524 of the light pipes 525 and set back from the light pipes 525. The brackets 526 supports the light pipes and provides a way to maintain the light pipes away from one another. The bracket 526 attaches to a rear portion of the light pipes 525.

As shown in FIGS. 5 and 6, the light pipe structure 523 can be installed over a printed circuit board 5 and the light pipe structure 523 can include a plurality of light pipes 525, each having an light entrance end, which can be the bottom surface 527, that faces a respective light emitting element 512 on a top surface of the printed circuit board 5. Each light pipe 525 can also have a light exit end, which can be the front surface 524, that can be parallel to the front wall 9 and/or can be coplanar to the front wall 9 or approximately coplanar to the front wall.

Figure 7:
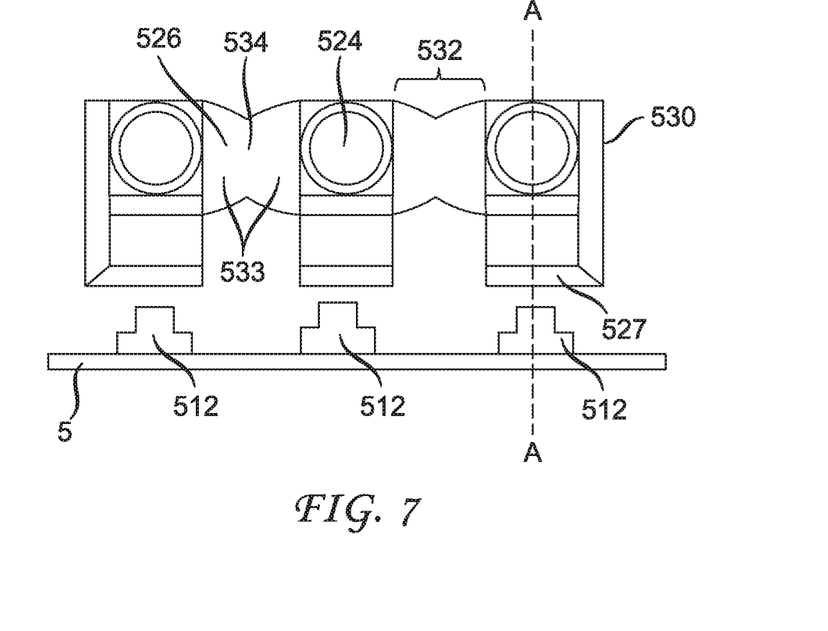
FIG. 7 shows the unitary light pipe structure according to the present principles in a front view.

The light pipe structure 523 will now be described in greater detail with reference to FIGS. 7 and 8. FIG. 7 is a distorted front view in which middle light pipe 525 is in plan view and the side light pipes are in front perspective view so that portions of side portion of the bracket 526 can be viewed.

As shown is FIG. 7, the bracket 526 further can include a narrow bridging regions 532 between broad support regions 530 in which a narrow bridging region 532 has proximal regions 533 that connect to the broad support region 530 and a central portion 534 between two proximal regions 533. The narrow bridging regions 532 can be positioned at, around or above the top half of the light pipes 525 and are narrower than the broad support regions 530 in the vertical dimension. The central portions 534 can be narrower than the proximal regions 533. The light pipe structure 523 prevents light from a respective light emitting element 512 for a respective light pipe 525 from propagating to other light pipes 525.

Figure 8:
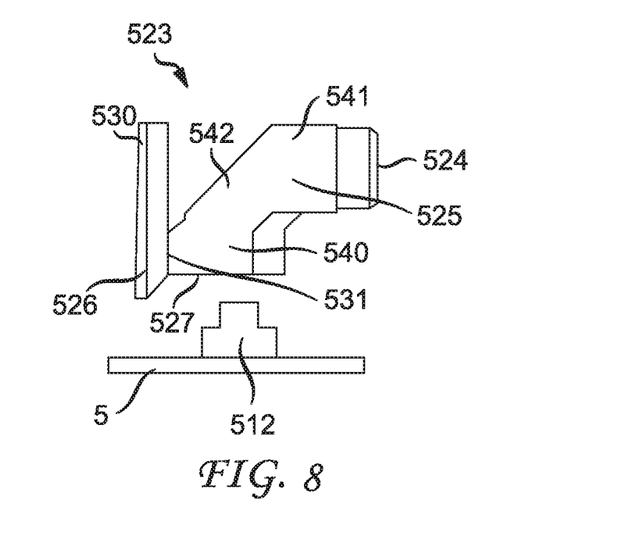
FIG. 8 shows a cross section view of the unitary light pipe structure according to the present principles cut along slice A-A in FIG. 7.

FIG. 8 is a cross sectional view of the light pipe structure 523 in FIG. 7 cut along slice A-A. As shown in FIG. 8, the bracket 526 connects and holds the light pipes 525, wherein the bracket includes broad support regions 530. As shown in FIG. 8, the broad support regions 530 connects to a back portion 531 of one light pipe 525 in which the broad support regions 530 can extend from below the entrance end 527 of the light pipe 525 toward above portions of the light exit end 524. FIG. 8 illustrates how the light pipes 525 can have a lower vertical body portion 540, an upper horizontal body portion 541, and a central body portion 542 between the lower vertical body portion and the upper horizontal body portion that leads to the light exit end or front surface 524.

Figure 9:
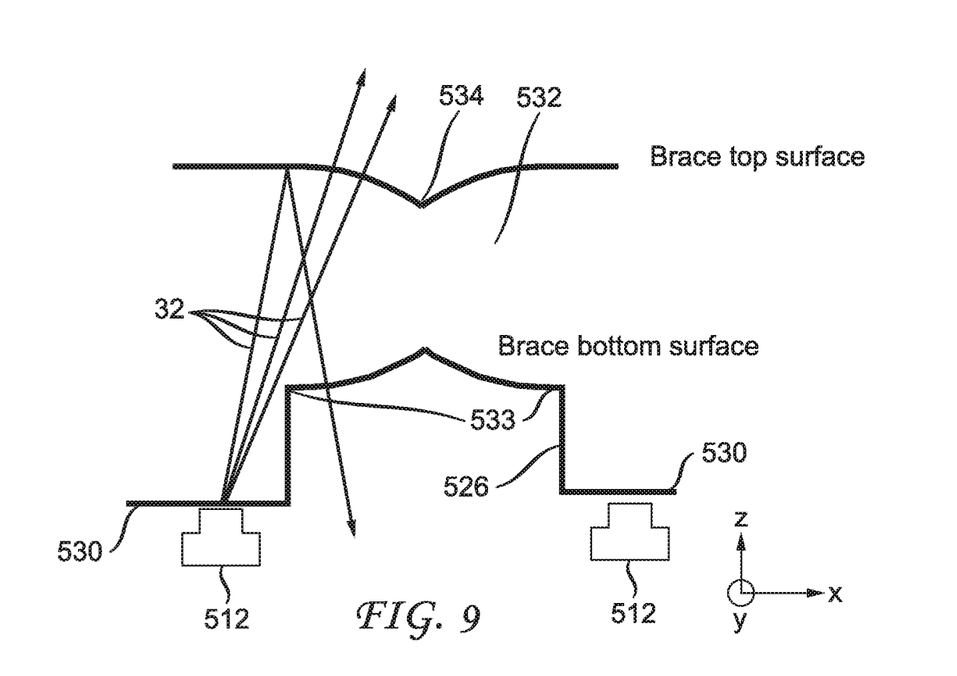
FIG. 9 shows a view of light propagation within the light pipe bracket of the unitary light pipe structure according to the present principles.

FIG. 9 is a simplified plan view perspective providing an example of how most or much of the light from a left light emitting element 512 that is assigned to one light pipe, once in the bracket 526 of the light pipe structure according to the present principles, does not have a propensity to propagate laterally to regions in the bracket 526 that are at and associated with other light emitting elements 512 and other light pipes. The light 32 shown in FIG. 9 is the light that has leaked from the light pipe 525 into the bracket 526. The way in which the top and bottom surfaces of the narrow bridging region 532 each have a concave shape that face each other as they extend from the proximal regions 533 at or near the broad support regions 530 to the central portion 534 has a positive influence. The concave shape at the top and bottom surfaces of the narrow bridging region 532 is preferably designed to be perpendicular to incident rays of light emitting from element 512 within the plan view perspective with respect to the x-z plane shown in FIG. 9; thus, a majority of the incident light incident on the concave shaped parts of the top and bottom surfaces can be transmitted out of the bracket. However, by having the concave shapes generally facing the incident light, even if there is some light incident on the top and bottom surfaces off normal incidence, the design will still provide a benefit and reduce leakage of such off normal light. Thus, light that would tend to propagate to the adjacent light pipe in the known light pipe structure will instead passes directly through the top and bottom surfaces in the concave shaped parts and out of the bracket which is constructed according to the present principles.

Figure 10:
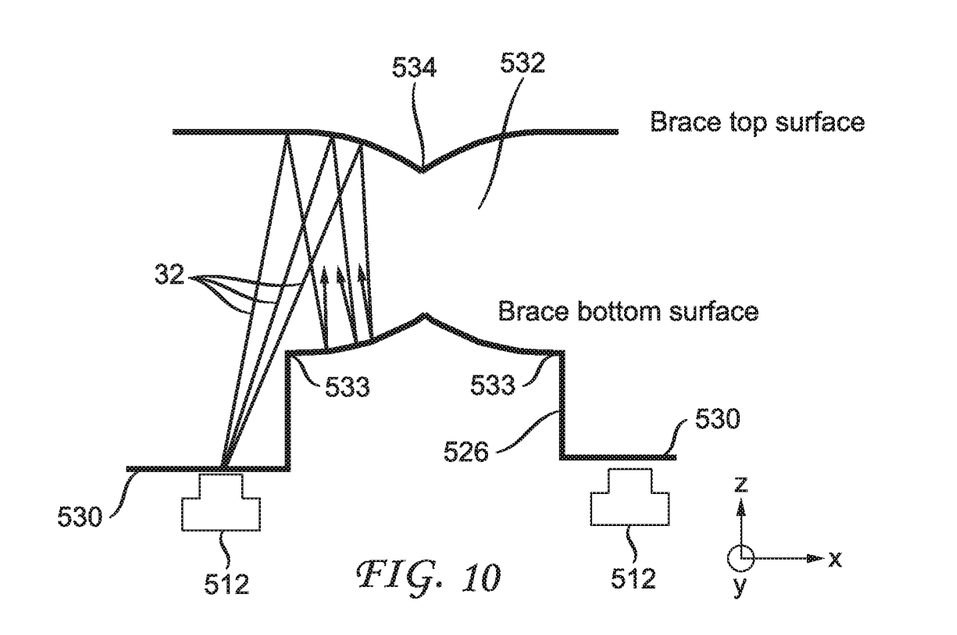
FIG. 10 shows another view of light propagation within the light pipe bracket of the unitary light pipe structure according to the present principles.

FIG. 10 is another simplified plan view perspective with respect to the x-z plane of the reflected light in the bracket 526. Preferably, the bracket 526 is designed such that the reflected light off of the top surface in FIG. 10 is significantly smaller in intensity than the light shown transmitting through the top surface in FIG. 9. However, it should be pointed out that with the bracket geometry that incorporates the concave shapes as shown in FIG. 10, stray or reflected light contained in the bracket that tends to propagate in the narrow bridging region 532 is reflected off of the top and bottom surfaces of narrow bridging region 532 in manner that directs such light to reflect back toward the emitting light emitting element 512 and the intended light pipe and/or in a manner that reduces the amount of light leakage passing to the adjacent unintended light pipe compared to that in the known light pipe structure.

Although the concave shape of the surfaces are effective, it should be noted that having the narrow bridging region 532 and having the narrow bridging region location higher than the lower vertical portion 540 of the light pipes 525 aids in reducing leakage. Further, having the narrow bridging region 532 around the same vertical position as the upper horizontal portion 541 of the light pipes 525 also aids in reducing leakage.

Figure 11A:
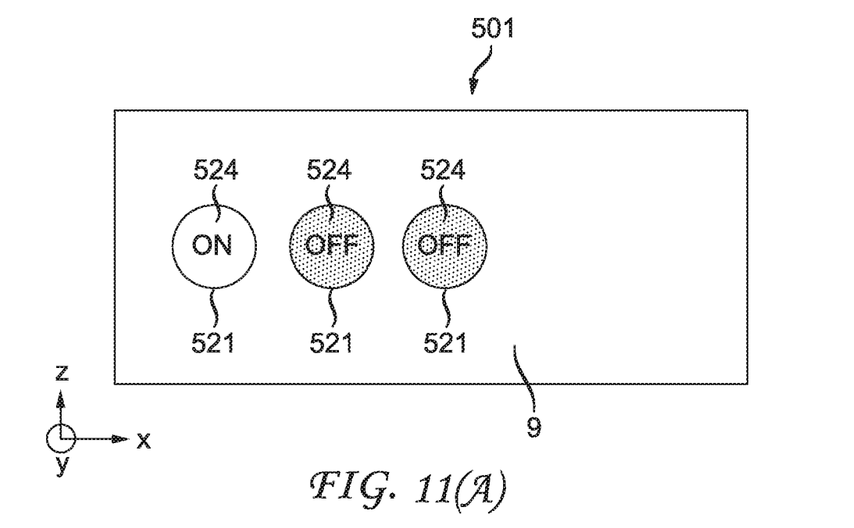
FIG. 11 shows front plan views of the electronic device according to the present principles showing different signal states.

FIG. 11 shows views of the front portion of the set top box 501 in FIG. 5 and exhibits the benefit of the preferred interior light propagation caused by the bracket geometry shown in FIGS. 9 and 10. FIG. 11A shows an example in which light emitting element or elements 512 for the left light pipe 225 are on and the light emitting element or elements 512 for the middle and right light pipe 525 are off. This example shows by way of a solid white color that the left light pipe 525 is properly illuminating the front surface 524 of the light pipe 525 and that the adjacent middle light pipe 525 has little or no light leaking into it to cause partial and non-uniform illuminating the front surface 524 of the middle light pipe 525.

Hence, as demonstrated in FIGS. 9, 10 and 11, a false or confusing signal indication for the function associated with the middle light pipe is not present according to the device of the present principles.

Figure 11B:
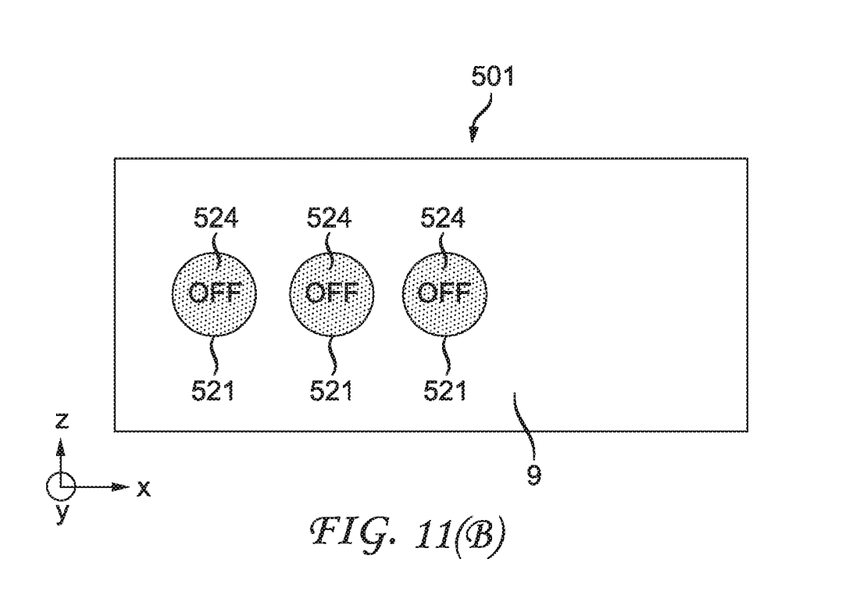

FIG. 11B shows the front surfaces 524 of the light pipes 525 when the light emitting elements 512 are not activated and shows that the front surfaces 524 in FIG. 11B which are all in the off condition are the same in terms of the lack of color as the middle and right front surfaces 524 in FIG. 11A.

Although the illustrative embodiments have been described herein with reference to the accompanying drawings, it is to be understood that the present principles are not limited to those precise embodiments, and that various changes and modifications may be effected therein by one of ordinary skill in the pertinent art without departing from the scope of the present principles. For example, although the figures show the light pipes as having generally rectangular interior cross sections, the light pipes can have circular profiles or other profiles according to present principles. Also, for example, although the figures show the structures as having three light pipes, structures having 2 or more than three light pipes are considered features of the present principles. Also, it should be noted that expressions such as "vertical," "horizontal," "front," "back," "top," bottom," "upper," "lower" and "over" are used in the description and claims with regards to certain elements with respect of an arbitrary coordinate system such as that shown in the figures; however, the invention is intended for use in components and/or the electronic devices that may be rotated 90 degrees, 180 degrees or to some other value either about a vertical reference line or a horizontal reference lines. This implies that "horizontal" can mean "vertical" and vice versa, "top" can mean "bottom" and vice versa, etc.

Further, the present principles are applicable to any electronic device including, but not limited to, a set top box, computer, game console, DVD player, CD player or the like, where the electronic device is provided with the improved light pipe structure. All such changes and modifications are intended to be included within the scope of the present principles as set forth in the appended claims.

The invention claimed is:

1. A bracket structure interconnecting multiple light pipes, the bracket structure comprising:
   a bracket that connects and supports the light pipes, the bracket being planar and having broad support regions that connect to a back portion of the light pipes, the bracket including at least one narrow bridging region between and co-planar with the broad support regions, the broad support regions being broader than the at least one narrow bridging region in a vertical dimension;
   wherein each narrow bridging region has a top surface and a bottom surface, each having an inward facing concave shape.

2. The bracket structure of claim 1, wherein the light pipes and the bracket are a unitary structure.

3. The bracket structure of claim 2, wherein the back portion of each of the light pipes is part of a lower vertical body portion.

4. The bracket structure of claim 3, wherein a central body portion is curved or disposed at an angle to cause light vertically directed into the lower vertical body portion to be horizontally directed into an upper horizontal body portion.

5. The bracket structure of claim 4, wherein the light pipes further comprise a bottom surface in the lower vertical body portion for entry of light.

6. The bracket structure of claim 5, wherein the light pipes further comprise a front surface in the upper horizontal body portion for light to exit.

7. The bracket structure of claim 4, wherein the at least one narrow bridging region between lateral positions of the light pipes has a bottom surface that is positioned higher in the vertical dimension than any part of the back portion of each of the light pipes that contact the support regions.

8. The bracket structure of claim 7, wherein each narrow bridging region has a vertical breadth that narrows from proximal regions adjacent to the broad support regions to a central portion.

9. The bracket structure of claim 8, wherein each narrow bridging region has a top surface and at least the top or the bottom surface has an inward facing concave shape from the proximal regions to the central portion.

10. The bracket structure of claim 8, wherein each narrow bridging region has a top surface and the top and the bottom surfaces have inward facing concave shapes from the proximal regions to the central portion.

11. A set top box, comprising:
    a casing having front wall;
    apertures in the front wall;
    a backlight assembly in back of the front wall within the casing; and
    a light pipe structure to receive light from the backlight assembly, the light pipe structure comprising:
    a plurality of light pipes, the light pipes having a lower vertical body portion, an upper horizontal body portion, and a central body portion between the lower vertical body portion and the upper horizontal body portion, the light pipes having front surfaces in the upper horizontal body portions, the front surfaces being positioned at or in the apertures; and
    a bracket that connects and supports the light pipes, the bracket being planar and having broad support regions that connect to a back portion of the light pipes, the bracket including at least one narrow bridging region between broad support regions, the broad support regions being broader than the at least one narrow bridging region in a vertical dimension;
    wherein each narrow bridging region has a top surface and a bottom surface, each having an inward facing concave shape.

12. The set top box of claim 11, wherein the light pipes and the bracket are a unitary structure.

13. The set top box of claim 12, wherein the back portion of each of the light pipes is part of the lower vertical body portion.

14. The set top box of claim 13, wherein the central body portion is curved or disposed at an angle to cause light vertically directed in the lower vertical body portion to be horizontally directed in the upper horizontal body portion.

15. The set top box of claim 14, wherein the set top box comprises a circuit board that supports the backlight assembly, and the light pipes further comprise bottom surfaces in the lower vertical body portions for entry of light from the backlight assembly, the bottom surfaces facing light emitting elements of the backlight assembly.

16. The set top box of claim 14, wherein the at least one narrow bridging region between lateral positions of the light pipes has a bottom surface that is positioned higher in the vertical dimension than any part of the back portion of each of the light pipes that contact the support regions.

17. The set top box of claim 16, wherein each narrow bridging region has a vertical breadth that narrows from proximal regions adjacent to the broad support regions to a central portion.

18. The set top box of claim 17, wherein each narrow bridging region has a top surface and at least the top or the bottom surface has an inward facing concave shape from the proximal regions to the central portion.

19. The set top box of claim 17, wherein each narrow bridging region has a top surface and the top and the bottom surfaces have inward facing concave shapes from the proximal regions to the central portion.

20. The set top box of claim 11, wherein the light pipes and the bracket are together homogeneous.

* * * * *